United States Patent
Mochizuki et al.

(10) Patent No.: US 6,742,581 B2
(45) Date of Patent: Jun. 1, 2004

(54) HEAT SINK AND FIN MODULE

(75) Inventors: Masataka Mochizuki, Nagareyama (JP); Koichi Mashiko, Utsunomiya (JP)

(73) Assignee: Fujikura Ltd., Tokyo (JP)

( * ) Notice: Subject to any disclaimer, the term of this patent is extended or adjusted under 35 U.S.C. 154(b) by 26 days.

(21) Appl. No.: 10/224,502

(22) Filed: Aug. 21, 2002

(65) Prior Publication Data

US 2003/0094275 A1 May 22, 2003

(51) Int. Cl.⁷ .................................................. F28F 7/00
(52) U.S. Cl. .................. 165/185; 165/80.3; 361/697; 361/704; 174/16.3; 257/722
(58) Field of Search ............... 165/80.3, 185; 361/709, 697, 704, 710; 257/722; 174/16.3

(56) References Cited

U.S. PATENT DOCUMENTS

| | | | | |
|---|---|---|---|---|
| 2,434,676 A | * | 1/1948 | Spender ................ | 165/80.3 |
| 2,653,800 A | * | 9/1953 | Anton ................... | 165/185 |
| 5,014,776 A | * | 5/1991 | Hess .................... | 165/185 |
| 5,558,155 A | * | 9/1996 | Ito ....................... | 165/80.3 |
| 5,771,966 A | * | 6/1998 | Jacoby ................. | 165/185 |
| 6,000,462 A | * | 12/1999 | Gonner ................ | 165/80.3 |
| 6,104,609 A | * | 8/2000 | Chen .................... | 361/695 |
| 6,340,056 B1 | * | 1/2002 | Huang et al. ........ | 165/185 |
| 6,449,160 B1 | * | 9/2002 | Tsai ..................... | 361/709 |
| 2003/0011992 A1 | * | 1/2003 | Kuo et al. ............ | 361/704 |

\* cited by examiner

Primary Examiner—Terrell Mckinnon
(74) Attorney, Agent, or Firm—Oblon, Spivak, McClelland, Maier & Neustadt, P.C.

(57) ABSTRACT

A heat sink comprises a base portion, and a multiplicity of thin plate fins erected on the base portion in parallel with each other. The fins are folded in two at their lower ends to form two-ply portions and are fixed by having the two-ply portions inserted into grooves formed in the base portion.

11 Claims, 7 Drawing Sheets

HEAT SINK AND FIN MODULE

BACKGROUND OF THE INVENTION

1. Field of the Invention

The present invention relates to a heat sink having a structure, in which flat plate heat radiation fins are mounted on the surface of a base portion, and a fin module to be used in the heat sink.

2. Related Art

As well known in the art, the heat sink is mounted on an object to increase the heat radiation area so as to promote the heat radiation from the object. Therefore, the heat sink may be basically constructed by mounting fin members of a suitable shape on the object in an excellent heat transfer slate. For the general purpose, however, the heat sink has to have a function to joint the fin members to the object. Generally, the heat sink is constructed by integrating the fin members with a base portion of a suitable shape. The base portion in the heat sink having the construction of this kind has no especial function in the heat radiation. In order to raise the heat radiation efficiency or the heat radiation capacity as much as possible, therefore, it is general to mount the heat radiation fins all over the surface of the base portion. An example of this heat sink is disclosed in Japanese Patent Laid-Open No. 11-87961 (JPA11-87961) or 2001-244677 (JPA2001-244677).

In the prior art, moreover, in order to improve the productivity of the heat sink having flat-shaped heat radiation fins, there is known a heat sink which is constructed by folding one metal sheet zigzag to form the heat radiation fin and by mounting the heat radiation fin on the base portion to cover the entire surface of the base portion. The heat radiation fin of this kind is called the "folded fin", which is constructed to have tunnel-shaped air passages and air passages opened upward are formed alternately of each other. This folded fin is used as a heat sink for cooling by forcedly blowing the air in the direction along the face of the heat radiation fin. One example of the heat sink of this kind is exemplified in U.S. Pat. No. 6,288,899.

For the heat sink having the construction in which the numerous fins are erected on the base portion, as disclosed in Japanese Patent Laid-Open No. 11-87961 (JPA11-87961) or 2001-244677 (JPA2001-244677), there is known a structure, in which the fins are mounted on the base portion prepared, or in which the two members are molded integrally with each other. For the former structure having the separate members of the base portion and the fins, these two members have to be integrally jointed. When means using a solder or a soft solder is adopted as the junction structure, however, the thin plate fins cannot retain a sufficient joint area. It is, therefore, difficult to mount the thin plate fins for an enlarged heat radiation area reliably and in a high strength on the base portion.

In order to eliminate this difficulty, there is conceivable a structure, in which grooves are formed in the base portion so that the thin plate fins are fixed by inserting their lower end portions into the grooves. For this structure, however, it is necessary to make the groove width the narrower for the thinner fins. However, the grooves to be molded simultaneously as the base portion is prepared are limited to a width or more. If a cutting method or the like is adopted for forming grooves having small opening widths, not only the number of working steps increases, but also the material yield drops thereby to cause a disadvantage of a low productivity.

On the other hand, the method for manufacturing the fins and the base portion integrally is exemplified by a casing method such as a die-casting method or by an extrusion-molding method. In order to make the fins into the thin plate shape, however, it is necessary to narrow the cavities or molds for the fins. Therefore, the molten metal fails to spread sufficiently into the cavities thereby to cause a casting defect or to break the molds easily. In order to avoid these problems, it is necessary to thick the fins or to lower the fin height with respect to the thickness. As a result, there arises a disadvantage that the fins have a high heat capacity or that a necessary and sufficient heat radiation area cannot be retained.

In the heat sink using the folded fins, on the other hand, these folded fins are jointed at the folded edges to the base portion. It is, therefore, difficult to retain the joint area. Moreover, the individual folded edges of the folded fins are not regularly arrayed on the flat face so that clearances are left between some folded edges and the surface of the base portion. As a result, the heat resistance inbetween may rise to lower the heat radiation characteristics. In the case of the forced air cooling by blowing air downward of the heat sink, moreover, the spaces between the fins have a tunnel shape by half so that they have to be opened upward. There arises another disadvantage that an additional work is required for cutting the folded edges of the folded fins.

SUMMARY OF THE INVENTION

The present invention has been conceived in view of the technical problems thus far described and has an object to provide a heat sink having excellent heat radiation characteristics and a satisfactory productivity, and a fin module for the heat sink.

In order to achieve the above-specified object, according to the present invention, there is provided a heat sink comprising: a base portion; and a multiplicity of thin plate fins erected on said base portion in parallel with each other, wherein said fins are folded in two at their lower ends to form two-ply portions and are fixed by having said two-ply portions inserted into grooves formed in said base portion.

In the present invention, therefore, the fins are fixed by inserting the two-ply portions folded thick in two into the grooves formed in the base portion, so that the grooves have a width two times as large as the thickness of the fins. Even if the fins are made of a thin plate shape, therefore, the grooves having the wide opening width can be formed in the base portion. Therefore, the grooves can be formed not by the cutting method but simultaneously with the manufacture time of casting or extrusion-molding the base portion. It is possible to improve the productivity of the base portion and to mount the fins easily on the base portion.

The present invention, portions adjacent to the openings of said grooves are caulked to make excess thicknesses to narrow the opening widths.

In the present invention, therefore, the two-ply portions are not only inserted into the grooves but also clamped by the grooves. Therefore, the mounting strength of the fins on the base portion is raised. As a result, it is possible not only to prevent the fins from coming out in advance but also to lower the heat resistance between the base portion and the fins thereby to improve the heat radiation characteristics as the heat sink.

According to the present invention, said grooves are made wider on their bottom sides than at their openings, and said two-ply portions inserted into said grooves are enlarged in the width direction of said grooves.

In the present invention, therefore, the expanded portions of the two-ply portions in the grooves are retained by the grooves so that the so-called "anchor effect (or anchoring effect)" is taken to prevent the fins reliably from coming out of the base portion.

According to the present invention, the heat sink further comprises rod-shaped members inserted into said two-ply portions so that said two-ply portions are expanded in the width direction of said grooves.

In the present invention, therefore, the two-ply portions expanded in the grooves take the solid structures, into which the rod-shaped members are inserted. As a result, it is possible to fix the fins more reliably on the base portion.

According to the present invention, the leading end portions of the folded portions forming said two-ply portions are held deeper on the bottom sides than the open ends of said grooves.

In the present invention, therefore, the leading end portions of the folded portions are retained on the inner walls of the grooves. Therefore, the fins do not come out of the grooves so that the strength of mounting the fins on the base portion can be raised.

According to the present invention, said fins are folded generally at a right angle at their upper end portions to form bent members to abut against the adjoining fins. Protrusions are formed at the leading end portions of said bent members, and recesses are so formed at the root end portions of said bent members that they may be jointed to said protrusions of the adjoining fins by fitting said protrusions therein. The fins arrayed in parallel with each other are jointed at their upper end portions by said protrusions and said recesses.

In the present invention, therefore, the bent members formed at the upper end portions of the fins abut against the adjoining fins. In this state, moreover, the protrusions and the recesses engage with each other to joint the upper end portions of the fins. Therefore, the spaces of the fins are kept substantially constant to smoothen the flow of air in the forced cooling case. The fins are regularly arrayed so that the product can give an excellent appearance while preventing its value from dropping.

According to the present invention, said bent members are so formed at the two end portions of said fins other than the widthwise central portions as to form openings in which spaces between the adjoining fins are opened on the upper end sides.

In the present invention, therefore, the bent members formed at the upper end portions of the fins do not cover the entire upper ends of the spaces between the fins, but the spaces are opened upward. By arranging fans while facing the openings, therefore, it is possible to cool the fins forcedly downward.

According to the present invention, moreover, there is provided a heat sink comprising: a base portion; and a multiplicity of thin plate fins erected on said base portion in parallel with each other, wherein said fins are folded generally at a right angle individually at their upper end portions and at their lower end portions to form bent members to abut against the adjoining fins, wherein protrusions are formed at the leading end portions of said bent members, and wherein recesses are so formed at the root end portions of said bent members that they may be jointed to said protrusions of the adjoining fins by fitting said protrusions therein, whereby the fins arrayed in parallel with each other are jointed individually at their upper end portions and at their lower end portions by said protrusions and said recesses.

In the present invention, therefore, the fins arrayed in parallel with each other are held at the constant interval by the bent members formed at their individual two upper and lower end portions, and their individual protrusions are made to engage with the recesses, so that the individual fins are jointed at their two upper and lower end portions. Therefore, the plurality of fins are integrated while being arrayed at the constant interval in parallel with each other. As a result, the fins can be mounted altogether on the base portion.

According to the present invention, said fins jointed by said protrusions and said recesses are mounted on said base portion at their flat face portion formed on the lower end side by said bent members.

In the present invention, the joint area of the fins to the base portion can be enlarged to integrate the fins reliably and firmly with the base portion. Moreover, the heat resistance inbetween can be lowered to improve the heat radiation characteristics as the heat sink.

According to the present invention, moreover, there is provided a fin module comprising a multiplicity of thin plate fins arrayed in parallel with each other, wherein said fins are folded generally at a right angle individually at their upper end portions and at their lower end portions to form bent members to abut against the adjoining fins, wherein protrusions are formed at the leading end portions of said bent members, and wherein recesses are so formed at the root end portions of said bent members that they may be jointed to said protrusions of the adjoining fins by fitting said protrusions therein, whereby the fins arrayed in parallel with each other are jointed individually at their upper end portions and at their lower end portions by said protrusions and said recesses.

In the present invention, therefore, the fins arrayed in parallel with each other are held at the constant interval by the bent members formed at their individual two upper and lower end portions, and the individual protrusions engage with the recesses so that the individual fins are jointed at their two upper and lower end portions. Therefore, the plurality of fins are arrayed and integrated at a constant interval in parallel with each other. The fins can be handled altogether in the integral state.

The above and further objects and novel features of the invention will more fully appear from the following detailed description when the same is read with reference to the accompanying drawings. It is to be expressly understood, however, that the drawings are for the purpose of illustration only and are not intended as a definition of the limits to the invention.

DETAILED DESCRIPTION OF THE PREFERRED EMBODIMENTS

Figure 1:
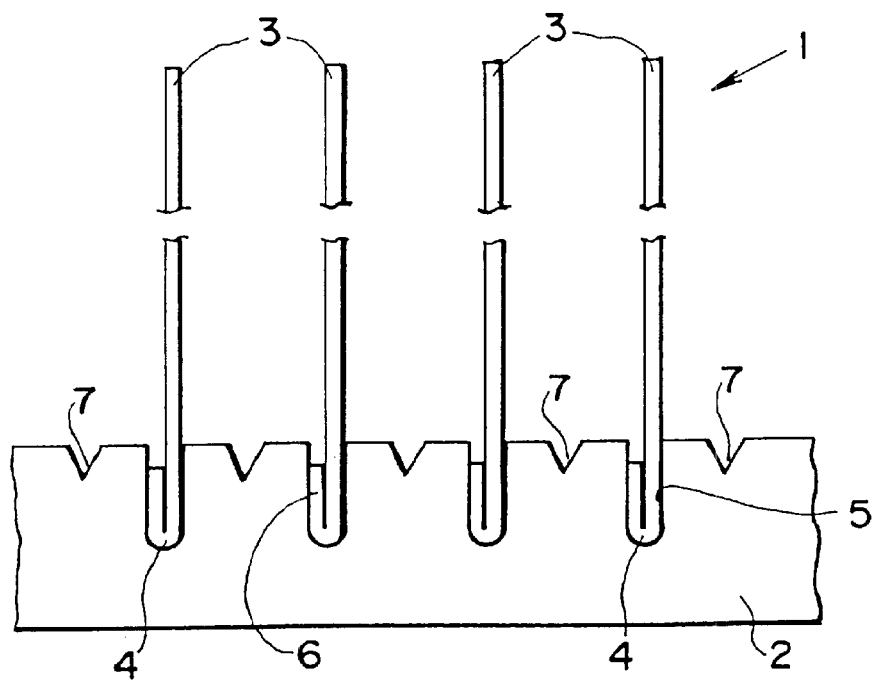
FIG. 1 is a side elevation schematically showing a portion of a heat sink according to one embodiment of the invention.

The invention will be described in connection with its specific embodiments with reference to the accompanying drawings. A heat sink 1 of the invention has a structure, in which a plurality of thin plate fins 3 are erected on a base portion 2. In FIG. 1 presenting a side elevation showing a portion of the heat sink 1, the fins 3 are made of a metal having a high heat conductivity such as aluminum, its alloy or copper and are constructed into a rectangular thin plate, for example. Each fin 3 is folded in two at its lower end portion (as located on the side of the base portion 2) of a predetermined length all over its width to form a two-ply portion 4. In other words, the lower end portion of the fin 3 is two times as thick as the remaining portions.

On the other hand, the base portion 2 is formed of a metal having a high heat conductivity such as aluminum, its alloy or copper into a flat plate shape. In the upper face (i.e., the face for mounting the fins 3) of the base portion 2, there are formed a plurality of grooves 5 which are arranged at a constant interval in parallel with each other. These grooves 5 have an opening width substantially double of the thickness of the fins 3, that is, substantially equal to or slightly smaller than the thickness of the two-ply portions 4. Moreover, these grooves 5 have a thickness larger than the length (i.e., the vertical height in FIG. 1) of the two-ply portions 4. Therefore, folded portions 6 forming the two-ply portions 4 enter so far from the open ends into the bottom sides of the grooves 5 that their upper end edges are hung on the inner walls of the grooves 5.

Between the open ends of the individual grooves 5, there are interposed caulking portions 7. There caulking portions 7 are formed, for example, by driving a (not shown) tool such as a chisel having a V-shaped edge. As these caulking portions 7 are thus formed, the excess thickness is moved to the sides of the individual grooves 5. As a result, the excess thickness acts to narrow the width of each groove 5 so that the lower end portion of the fin 3, i.e., the two-ply portion 4 is clamped by the grooves 5. As a result, the fins 3 are firmly fixed with respect to the base portion 2. By thus moving the excess thickness, moreover, the openings of the grooves 5 are deformed narrower so that the lower end portions of the folded portions 6 bite into the side walls of the grooves 5. As a result, the fins 3 are firmly prevented from coming out.

The heat sink 1 thus constructed is held, when used, in contact either with an exothermic part such as an arithmetic element or with a (not-shown) heat pipe for transporting the heat from the exothermic part to the base portion 2. When the heat of the exothermic part is transmitted to the base portion 2, it is transmitted to the fins 3 and is dissipated therefrom to the ambient atmosphere. In this case, the lower end portions of the fins 3 are firmly clamped in close contact with the base portion 2 by the grooves 5. Therefore, the heat resistance between the base portion 2 and the fins 3 is low so that the heat can be efficiently transmitted and dissipated from the base portion 2 to the fins 3. In short, the heat sink 1 has excellent heat radiation characteristics. With the construction thus made, the grooves 5 to be formed in the base portion 2 can be made two times as large as the thickness of the fins 3. Simultaneously as the base portion 2 is manufactured by an extrusion-molding method, therefore, the grooves 5 can be formed. As a result, the number of steps to work the entire heat sink 1 including the base portion 2 can be reduced to improve the productivity.

Here, the caulking portions 7 are formed to enhance the mounting strength of the fins 3. When the two-ply portions 4 of the fins 3 are press-fitted into the grooves 5, therefore, the caulking portions 7 need not be especially formed.

Figure 2:
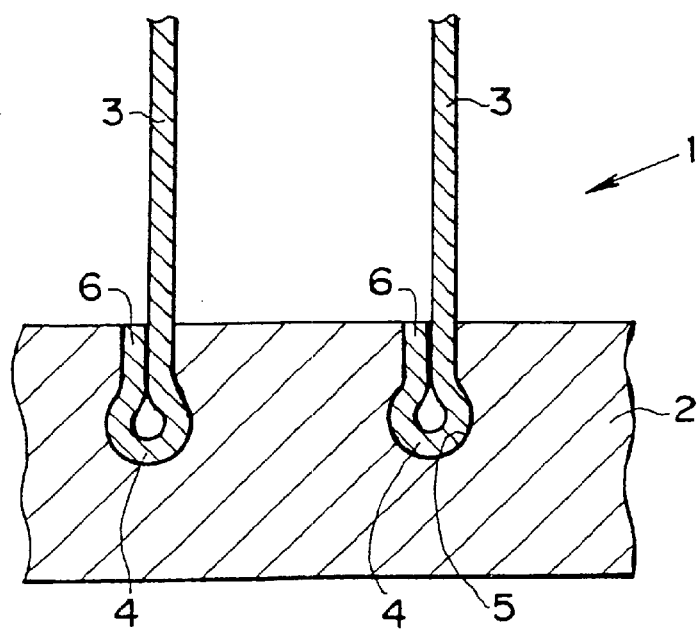
FIG. 2 is a sectional view showing a portion of an example of a structure, in which two-ply portions of the heat sink are widened.
Figure 3:
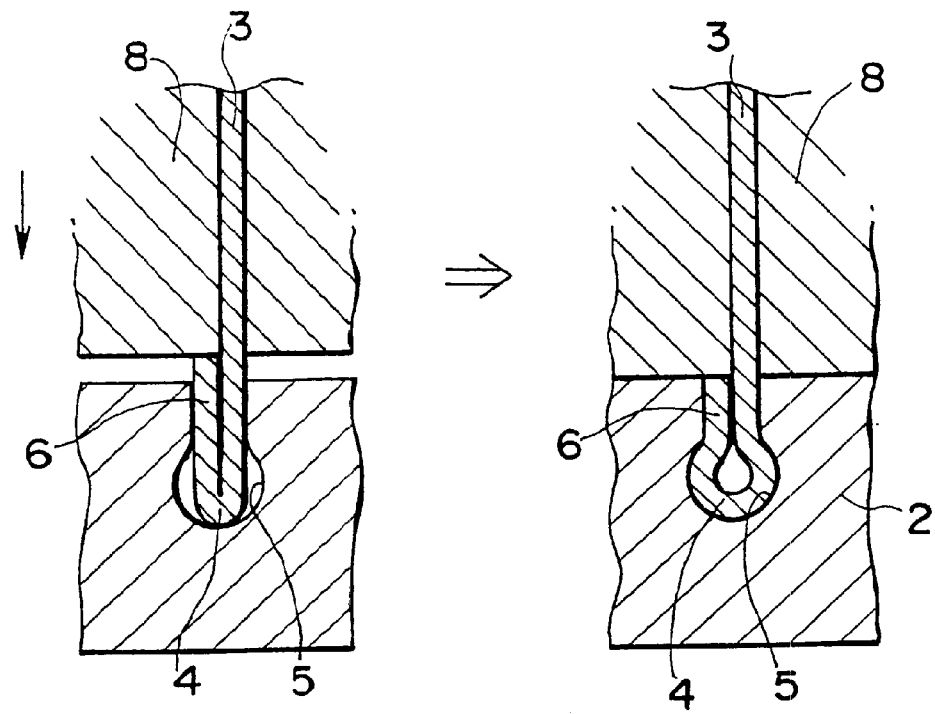
FIG. 3 is a sectional view showing a portion of an example of a working step, at which the two-ply portion of the heat sink is widened.

Other embodiments of the invention will be described in the following. FIGS. 2 and 3 are sectional views schematically showing other examples of the invention, which are constructed so that the two-ply portions 4 may take anchor effects. Specifically, each groove 5 is formed into a sectional shape, in which the bottom side (as located on the lower side of FIGS. 2 and 3) is made wider than the opening width, that is, into a generally circular sectional shape. The groove 5 has an opening width set about two times as large as the thickness of the fin 3. The grooves 5 thus shaped can be formed simultaneously as the base portion 2 is extrusion-molded, for example.

On the other hand, each two-ply portion 4, as inserted into the groove 5 formed at the lower end portion of the fin 3, is expanded along the inner face of the groove 5. Specifically, the two-ply portion 4 is expanded transversely of FIGS. 2 and 3 to form a circular section. The fin portion thus expanded widthwise of the groove 5 is retained in the groove 5 so that the fin 3 is prevented from coming out of the groove 5, thereby to raise the mounting strength of the fin 3 on the base portion 2. In other words, the fin 3 can be reliably mounted on the base portion 2.

The aforementioned work to enlarge the two-ply portion 4 of the fin 3 can also be done by inserting a tool into the clearance of the two-ply portion 4 thereby to deform the two-ply portion 4 widthwise of the groove 5. Alternatively, the two-ply portion 4 is buckled and enlarged, as shown in FIG. 3. Specifically, the length (or height) of the folded portion 6 forming the two-ply portion 4 is larger than the depth of the groove 5, and the end portion of the folded portion 6 is protruded from the groove 5. In this state, the fin 3 and the folded portion 6 are pressed with a suitable jig 8 along the face of the fin 3 toward the groove 5. Then, the two-ply portion 4 is buckled and opened so that it can be expanded into a shape along the inner face of the groove 5.

Figure 4:
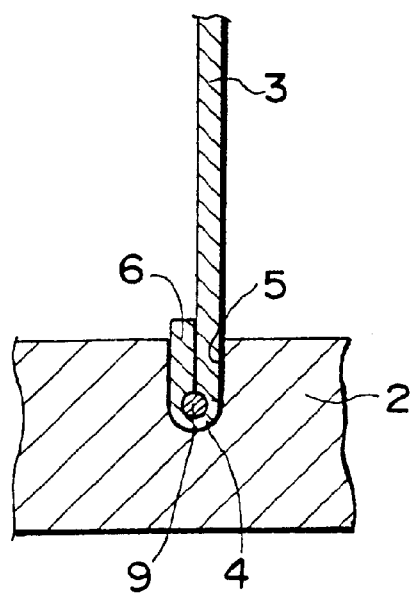
FIG. 4 is a sectional view showing a portion of an example, in which a pin is press-fitted in the two-ply portion.

Here in the invention, the groove 5 need not be expanded on its bottom side, but the two-ply portion 4 may be expanded, as exemplified in FIG. 4. In a structure of this example, the two-ply portion 4 is inserted into the groove 5 having a constant width, and a rod-shaped member such as a pin 9 is press-fitted into the clearance of the two-ply portion 4 thereby to press and expand the two-ply portion 4 transversely.

In this structure, the outer faces of the two-ply portion 4 are pushed onto the inner face of the groove 5 so that their frictional forces are raised to improve the mounting strength of the fin 3 on the base portion 2 while lowering the heat resistance inbetween. When the groove 5 is deformed to have a larger width by press-fitting the pin 9, the two-ply portion 4 takes the anchor effect, as in the example shown in FIGS. 2 and 3, so that the fin 3 is more reliably prevented from coming out.

Figure 5:
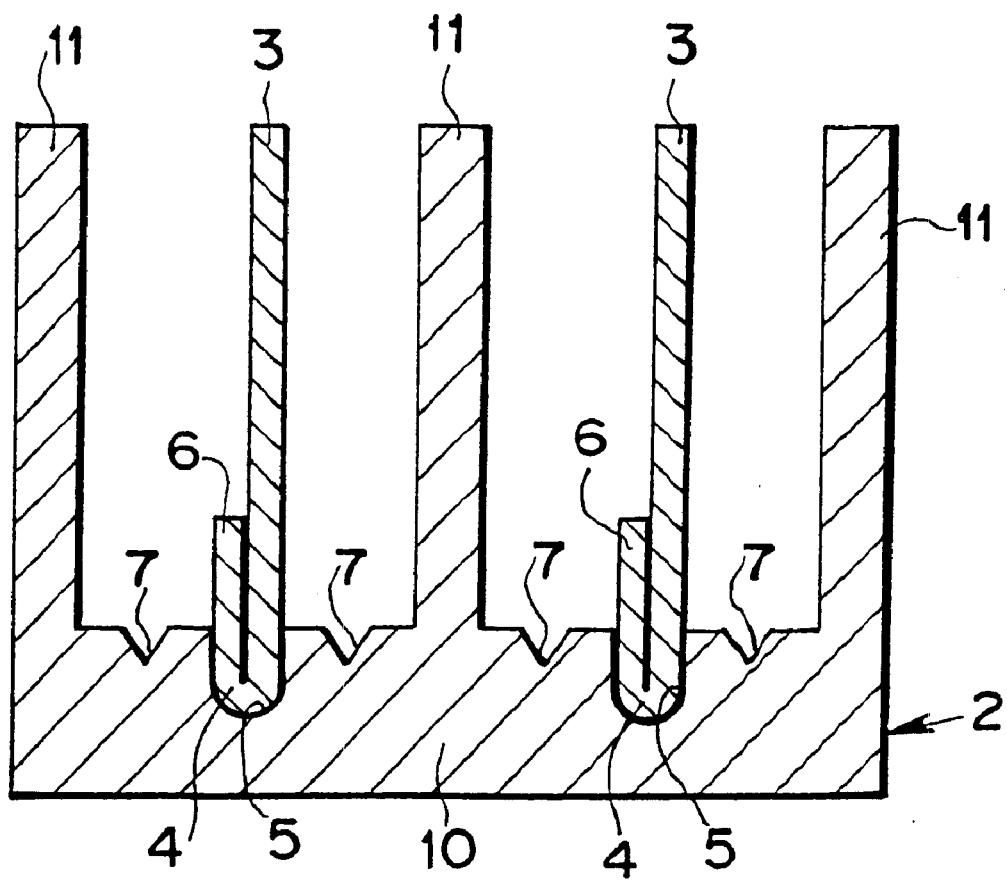
FIG. 5 is a side elevation schematically showing a heat sink according to another embodiment of the invention.

Here, the base portion 2 in the invention should not be limited to the aforementioned flat plate shape. For example, a flat plate portion 10 and a plurality of relatively thick heat radiation fin portions 11 are integrally formed by an extrusion-molding method, as shown in FIG. 5. The two-ply portions 4 formed at the lower end portions of the fins 3 are inserted into the grooves 5 which are formed between the heat radiation fin portions 11. The two sides of the two-ply portions 4 are caulked by forming the caulking portions 7 so that the fins 3 may be firmly fixed in the grooves 5.

Figure 6:
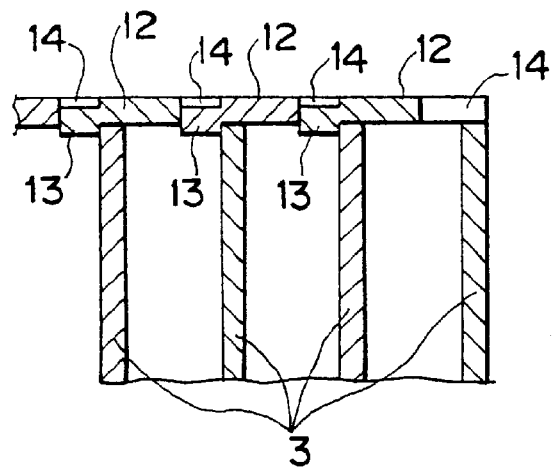
FIG. 6 is a sectional view showing a portion of a construction, in which fins are jointed at their upper end portions.
Figure 7:
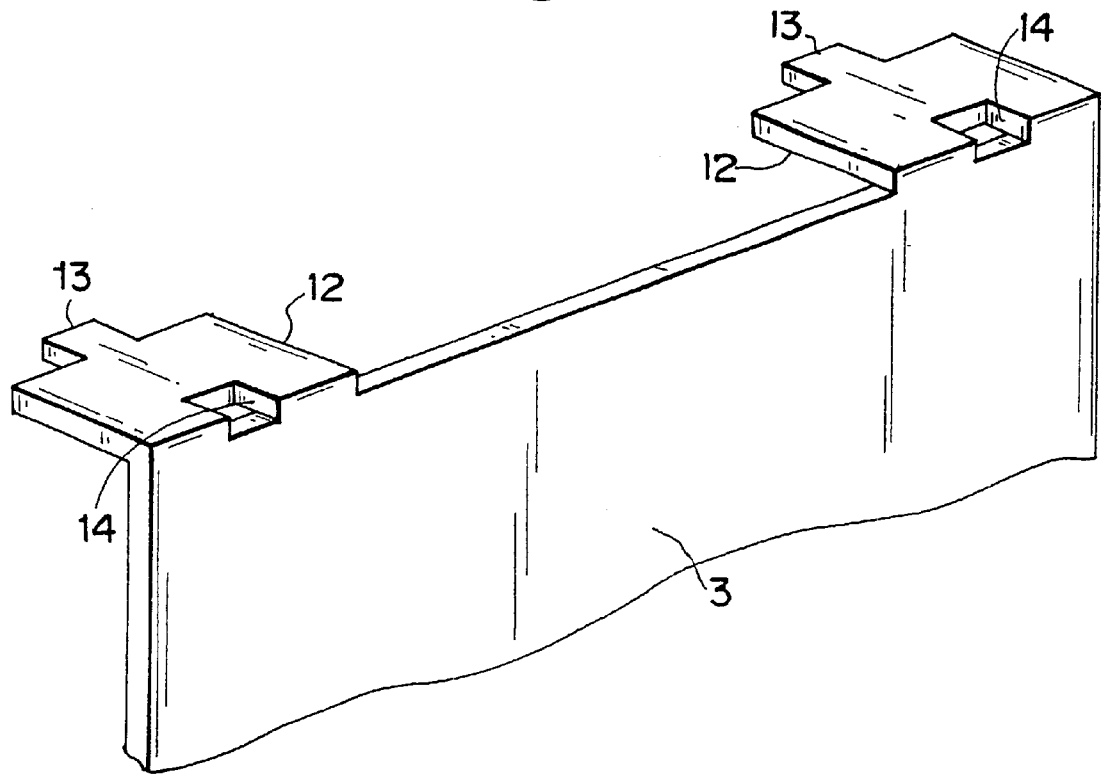
FIG. 7 is a perspective view showing a portion of an example of bent members, protrusions and through holes formed in the upper end portion of the fin.
Figure 8:
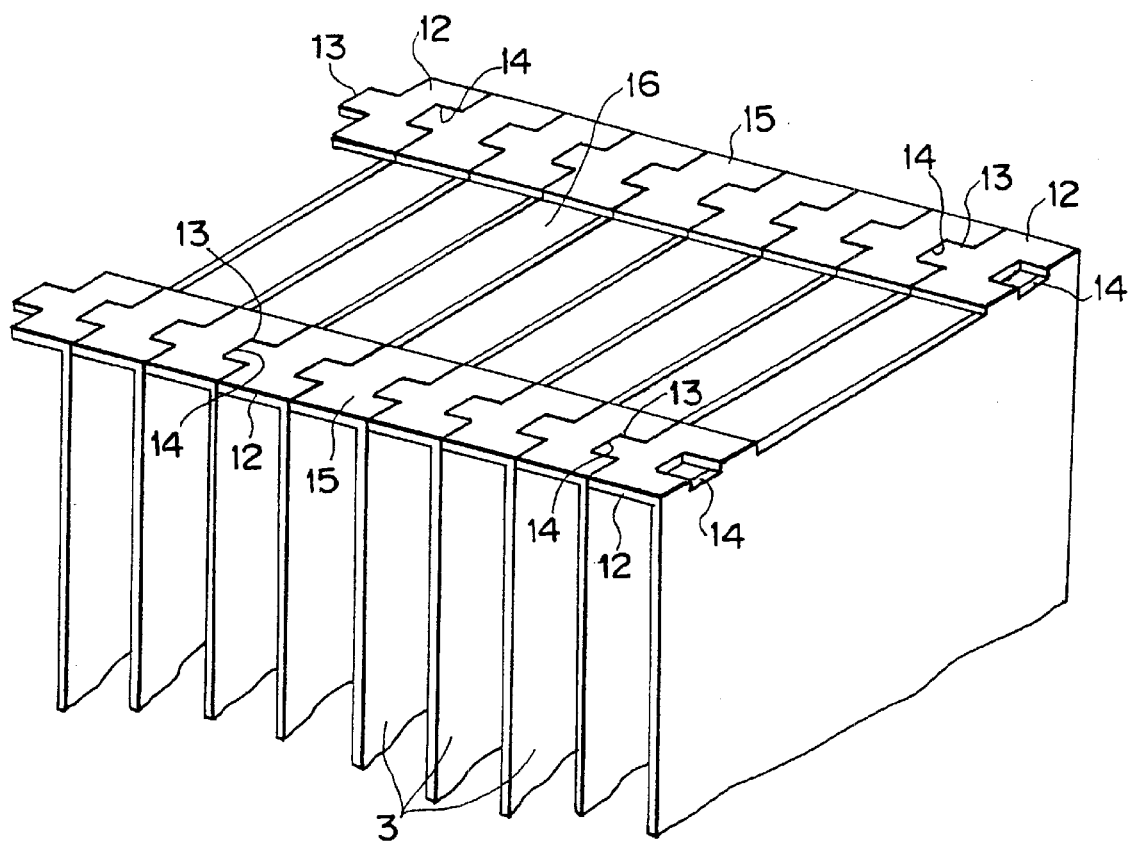
FIG. 8 is a perspective view showing one example of the state, in which the fins are jointed at their upper end portions.

These fins 3 are arranged at a generally constant interval in parallel with each other. In order to hold this array state, the fins 3 can be jointed at their upper end portions to each other, as will be exemplified in the following. At the upper end portions of the individual fins 3, as shown in FIGS. 6 to 8, there are formed bent members 12 which are bent generally at a right angle. These bent members 12 may be formed at the upper end portions of each fin 3 all over the width of the fin 3. In the embodiment shown in FIGS. 6 to 8, however, the bent members 12 are formed on the two right and left end sides.

At the leading central end portion of each bent member 12, moreover, there is formed a protrusion 13. This protrusion 13 is matched in shape by a through hole 14, which is formed at such a portion in the root end portion of each bent member 12 as to correspond to each protrusion 13. This through hole 14 corresponds to the recess of the invention for fitting the adjoining protrusion 13 thereby to joint the upper end portions of the adjoining fins 3.

By arraying the fins 3 in parallel with each other at an interval substantially equal to the protruding length of the bent members 12, more specifically, the leading end portions of the bent members 12 abut against the back sides of the upper end portions of the adjoining fins 3 thereby to hold the upper end portions of the fins 3 at the constant interval. In this state, the protrusions 13 are fitted in the through holes 14 of the adjoining fins 3. In this state, a pushing force or an impact is applied to the protrusions 13 in a direction to push the protrusions 13 into the through holes 14. Then, the portions of the protrusions 13 on the leading end sides dive into the through holes 14 so that they come into engagement with those upper end edge portions of the fins 3, which appear in the through holes 14. Namely, those are under engaging status.

On the two right and left sides of the upper end portion of the fins 3 thus jointed, there are formed flat plate portions 15 which are made by arranging the individual bent members 12 continuously. Between the flat plate portions 15, there are formed openings 16 which are located at the central portions of the width direction. Moreover, the spaces between the individual fins 3 are opened upward through the openings 16. By arranging (not-shown) fans in the openings 16, therefore, the heat sink 1 can be forcedly air-cooled downward (i.e., in the direction toward the base portion 2).

The aforementioned bent members 12, protrusions 13 and through holes 14 perform the function to joint the fins 3 to each other. If the bent members, the protrusions and the through holes of this kind are provided on the lower end sides of the fins 3 thereby to joint the lower end portions of the fins 3, therefore, the plurality of fins 3, as arrayed at the constant interval in parallel with each other, can be jointed in series so that they can be handled as an integral module, as shown in FIGS. 9 and 10.

Figure 9:
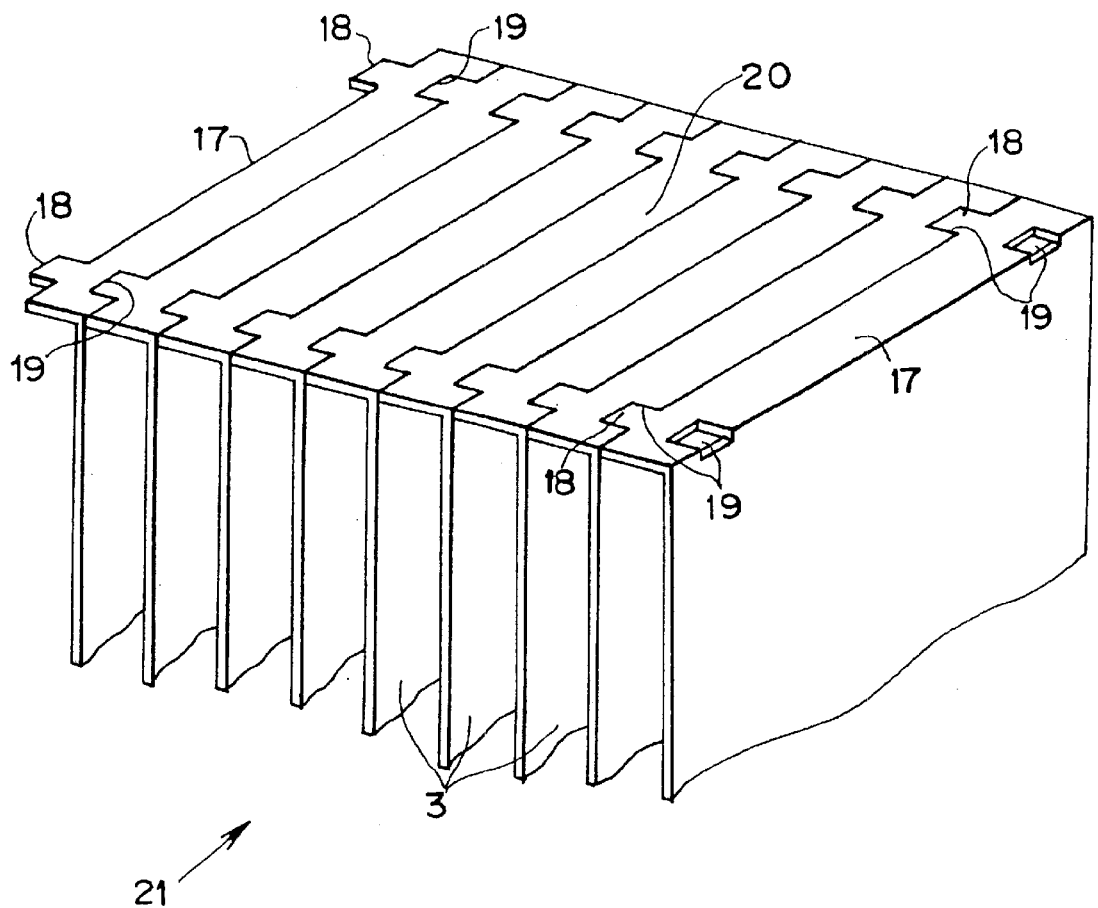
FIG. 9 is a perspective view taken on the bottom face side and showing one example of the module which is constructed by jointing the fins at their lower end portions through the bent members.
Figure 10:
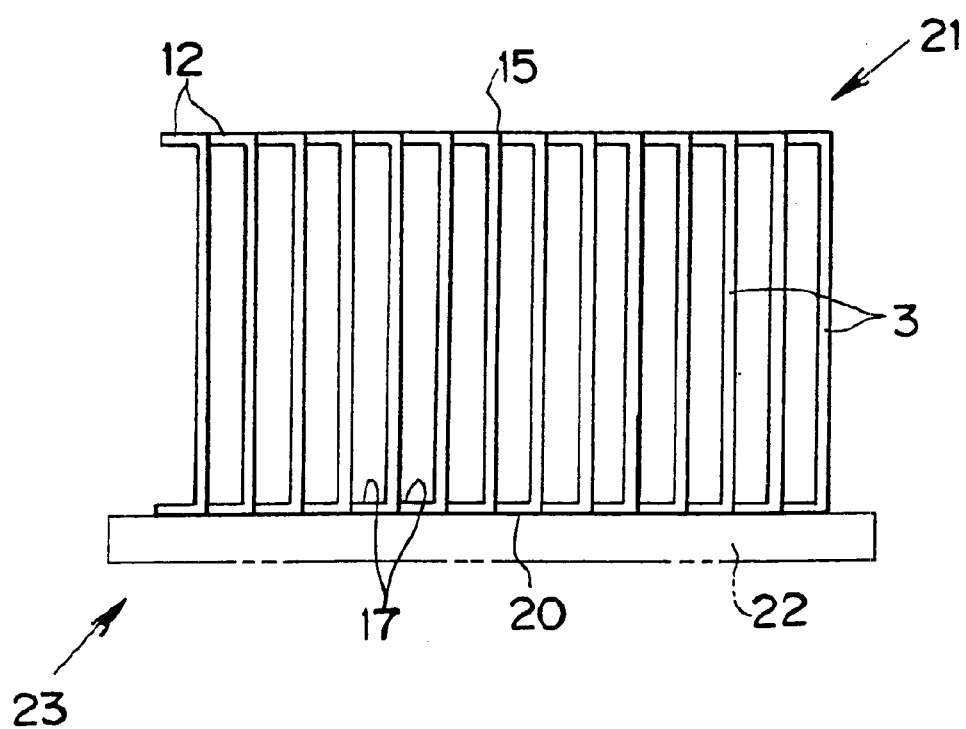
FIG. 10 is a side elevation schematically showing one example of a heat sink using the module.

FIG. 9 shows the plurality of fins 3, which are jointed each other at their upper end portions by the bent members 12, the protrusions 13 and the through holes 14, upside down. On the lower end portions of those fins 3, there are formed bent members 17 which extend throughout the width direction. Those bent members 17 are so formed with bending the lower end portion of fins 3 generally at a right angle, and at a plurality of portions (i.e., two portion in the shown example) of the leading ends of the fins 3, there are formed protrusions 18, which are to be fitted in through holes 19 so that the fins 3 may be jointed to each other. The through holes 19 are formed in the root end portions of the individual protrusions 17.

Moreover, the fins 3 are jointed at their lower end portions to each other by bringing the leading end portions of the individual bent members 17 into abutment against the back sides of the adjoining fins 3, by fitting the protrusions 18 in the through holes 19 of the adjoining fins 3 and by deforming the protrusions 13 like before. In the example shown in FIGS. 9 and 10, the bent members 17 are formed throughout the width direction of the fins 3 so that a bottom face portion 20 is formed of those bent members 17 on the lower end portions of the fins 3.

A module 21 thus having the plurality of fins 3 jointed integrally can be used as a heat sink 23 by jointing the aforementioned bottom face portion 20 to the upper face of a suitable base portion 22. Here, the joint to the base portion 22 can be made by various joint means using a solder, a soft solder or an adhesive. Moreover, the module 21 is jointed at its bottom face portion 20 to the upper face of the base portion 22 so that its joint area is enlarged. Therefore, the fins 3 can be integrated in a high strength but without fail with the base portion 22. At the same time, the heat resistance between the base portion 22 and the fins 3 or the module 21 is lowered to improve the heat radiation characteristics as the heat sink 23.

Here, the invention should not be limited to the specific embodiments thus far described but, in short, may be constructed such that the portions folded into the two-ply portions are inserted and fixed in the grooves formed in the base portion. Therefore, the fixing means may be exemplified not only by narrowing the opening widths of the grooves by the caulking portions but also by press-fitting wedges together with the two-ply portions into the grooves.

According to the present invention, as has been described hereinbefore, even if the fins are made of a thin plate shape, the grooves having the wide opening width for mounting the fins can be formed in the base portion. Therefore, the grooves can be formed not by the cutting method but simultaneously with the manufacture time of casting or extrusion-molding the base portion. As a result, it is possible to improve the productivity of the base portion and to mount the fins easily on the base portion. Therefore, it is possible to provide a heat sink of excellent productivity. Moreover, the area for the close adhesion between the fins and the base portion is enlarged to lower the heat resistance inbetween. As a result, it is possible to provide a heat sink of excellent heat radiation characteristics.

According to the present invention, moreover, the two-ply portions are not only inserted into the grooves but also clamped by the grooves so that the mounting strength of the fins on the base portion is raised. As a result, it is possible not only to prevent the fins from coming out in advance but also to lower the heat resistance between the base portion and the fins thereby to improve the heat radiation characteristics as the heat sink.

According to the present invention, moreover, the expanded portions of the two-ply portions in the grooves are retained by the grooves so that the so-called "anchor effect (or anchoring effect)" can be taken to prevent the fins reliably from coming out of the base portion.

According to the present invention, still moreover, the two-ply portions expanded in the grooves take the solid structures, into which the rod-shaped members are inserted. As a result, it is possible to fix the fins more reliably on the base portion.

According to the present invention, moreover, the leading end portions of the folded portions are retained on the inner walls of the grooves. Therefore, the fins do not come out of the grooves so that the strength of mounting the fins on the base portion can be raised.

According to the present invention, still moreover, the spaces of the fins are kept substantially constant to smoothen the flow of air in the forced cooling case. The fins are regularly arrayed so that the product can give an excellent appearance while preventing its value from dropping.

According to the present invention, still moreover, the bent members formed at the upper end portions of the fins do not cover the entire upper ends of the spaces between the fins, but the spaces are opened upward. By arranging fans while facing the openings, therefore, it is possible to cool the fins forcedly downward.

According to the present invention, moreover, the fins arrayed in parallel with each other are held at a constant interval by the bent members formed at their individual two upper and lower end portions, and their individual protrusions are made to engage with the recesses, so that the individual fins are jointed at their two upper and lower end portions. Therefore, the plurality of fins are integrated while being arrayed at the constant interval in parallel with each other, so that they can be mounted altogether on the base portion.

According to the present invention, moreover, the joint area of the fins to the base portion can be enlarged to integrate the fins reliably and firmly with the base portion. Moreover, the heat resistance inbetween can be lowered to improve the heat radiation characteristics as the heat sink.

According to the present invention, moreover, the fins arrayed in parallel with each other are held at the constant interval by the bent members formed at their individual two upper and lower end portions, and the individual protrusions engage with the recesses so that the individual fins are jointed at their two upper and lower end portions. Therefore, the plurality of fins are arrayed and integrated at a constant interval in parallel with each other so that the fins can be handled altogether in the integral state. In addition, it is possible to easily manufacture a heat sink which is constructed to have a plurality of a thin plate shape integral with the base portion.

What is claimed is:

1. A heat sink comprising:
   a base portion having grooves formed therein; and
   a plurality of thin plate fins erected on the base portion in parallel with each other, at least two fins of said plurality of thin plate fins having two-ply portions formed by folding lower end portions of the at least two fins in two,
   wherein said two-ply portions are inserted in the grooves formed in the base portion,
   wherein said at least two fins have:
      bent members formed at upper end portions of the at least two fins and folded generally at a right angle to abut against an adjoining fin,
      protrusions formed at leading end portions of said bent members, and
      recesses formed at root end portions of said bent members so that the recesses are jointed to said protrusions of the adjoining fin by fitting said protrusions therein,
   wherein an opening is formed between two bent members that are formed at end portions of the at least two fins, and
   wherein a space between the at least two fins is opened on an upper end side.

2. A heat sink according to claim 1, wherein portions adjacent to openings of said grooves are caulked to narrow opening widths of the openings.

3. A heat sink according to claim 1, wherein said grooves have a bottom width that is wider than a width of an opening thereof, and wherein said two-ply portions have a width greater than the width of the opening of said grooves.

4. A heat sink according to claim 3, further comprising rod-shaped members inserted into said two-ply portions so that said two-ply portions are expanded in a width direction of said grooves.

5. A heat sink according to claim 1, wherein leading end portions of folded portions forming said two-ply portions are longer than a depth of said grooves.

6. A heat sink comprising:
   a base portion having grooves formed therein; and
   a plurality of thin plated fins erected on the base portion in parallel with each other, said plurality of thin plated fins further comprising:
      bent members formed at lower end portions of the fins individually and folded generally at a right angle to abut against adjacent fins,
      recesses so formed at root end portions of said bent members, and
      protrusions formed at leading end portions of said bent members and inserted into the recesses of the adjacent fin to fasten to the adjacent fin integrally, forming at least one substantially continuous and flat surface,
   whereby the fins arrayed in parallel with each other are jointed individually at their lower end portions by said protrusions and said recesses.

7. A heat sink according to claim 6,
   wherein said fins jointed by said protrusions and said recesses are mounted on said base portion at the at least one substantially continuous and flat surface their formed on the lower end side by said bent members.

8. A fin module comprising:
   a plurality of thin plate fins arrayed in parallel with each other, said plurality of thin plate fins further comprising:
      bent members folded generally at a right angle of the fins to abut against adjacent fins, said bent members being formed at upper end portions and at lower end portions of the fins individually,
      recesses so formed at root end portions of said bent members, and
      protrusions formed at leading end portions of said bent members and inserted into the recesses of the adjacent fin to fasten to the adjacent fin integrally, forming at least one substantially continuous and flat surface,
   whereby the fins arrayed in parallel with each other are jointed individually at their upper end portions and at their lower end portions by said protrusions and said recesses.

9. A heat sink according to claim 7, wherein said fins are mounted to said base portion by inserting said at least one substantially continuous and flat surface into at least one of said grooves.

10. A fin module according to claim 8, wherein said fins are mounted to said base portion by inserting said at least substantially continuous and flat surface into at least one of said grooves.

11. A fin module according to claim 8, wherein said bent members are formed over substantially a width of each fin, said at least one substantially continuous and flat surface is a single substantially continuous and flat surface, and said fins are mounted to said base portion by inserting said single substantially continuous and flat surface into one of said grooves.

\* \* \* \* \*

UNITED STATES PATENT AND TRADEMARK OFFICE
CERTIFICATE OF CORRECTION

PATENT NO. : 6,742,581 B2
DATED : June 1, 2004
INVENTOR(S) : Masataka Mochizuki et al.

It is certified that error appears in the above-identified patent and that said Letters Patent is hereby corrected as shown below:

<u>Column 10,</u>
Line 42, please delete "their".

Signed and Sealed this

Fourteenth Day of September, 2004

JON W. DUDAS
*Director of the United States Patent and Trademark Office*